US 6,748,520 B1

(12) United States Patent
Maynard et al.

(10) Patent No.: US 6,748,520 B1
(45) Date of Patent: Jun. 8, 2004

(54) SYSTEM AND METHOD FOR COMPRESSING AND DECOMPRESSING A BINARY CODE IMAGE

(75) Inventors: Stephen Maynard, Lake Zurich, IL (US); Mark O. Vogel, Hampshire, IL (US); Robert Lancelot, Barrington, IL (US); Douglas Newlin, Wheaton, IL (US)

(73) Assignee: 3Com Corporation, Marlborough, MA (US)

( * ) Notice: Subject to any disclaimer, the term of this patent is extended or adjusted under 35 U.S.C. 154(b) by 0 days.

(21) Appl. No.: 09/563,606

(22) Filed: May 2, 2000

(51) Int. Cl.$^7$ ................................ G06F 3/00; G06F 7/00
(52) U.S. Cl. ...................... 712/220; 712/215; 341/51
(58) Field of Search ....................... 712/220, 215, 712/24; 341/51, 65, 67, 87, 95; 704/502; 382/245, 232, 233, 234, 235, 238, 246

(56) References Cited

U.S. PATENT DOCUMENTS

| | | | | |
|---|---|---|---|---|
| 4,464,650 A | * | 8/1984 | Eastman et al. | 341/51 |
| 4,947,259 A | | 8/1990 | Katsuta | 358/426 |
| 5,087,913 A | * | 2/1992 | Eastman | 341/95 |
| 5,146,221 A | * | 9/1992 | Whiting et al. | 341/67 |
| 5,506,580 A | | 4/1996 | Whiting et al. | 341/51 |
| 5,539,842 A | | 7/1996 | Schwartz | 382/232 |
| 5,623,423 A | * | 4/1997 | Lipovski | 708/203 |
| 5,627,534 A | * | 5/1997 | Craft | 341/87 |
| 5,680,129 A | * | 10/1997 | Weinberger et al. | 341/65 |
| 5,742,930 A | * | 4/1998 | Howitt | 704/502 |
| 5,974,179 A | | 10/1999 | Caklovic | 382/232 |
| 6,044,450 A | * | 3/2000 | Tsushima et al. | 712/24 |
| 6,049,390 A | * | 4/2000 | Notredame et al. | 358/1.15 |

OTHER PUBLICATIONS

Steven W. Smith, *Data Compression*, The Scientist and Engineer's Guide to Digital Signal Processing, Chapter 27, pp. 1–23.
Jerry D. Gibson, "*Lossless Compression*", The Communications Handbook, Chapter 98, 1997, pp. 1397–1410.
Jerry D. Gibson, "*Video*", The Communications Handbook, Chapter 102, 1997, pp. 1449–1461.
Jerry D. Gibson, "*The High–Definition Television Grand Alliance System*", The Communications Handbook, Chapter 103, 1997, pp. 1462–1474.
Jerry D. Gibson, "*Cable*", The Communications Handbook, Chapter 105, 1997 pp. 1488–1501.
Jerry D. Gibson, "*Desktop Videoconferencing*", The Communications Handbook, Chapter 107, 1997, pp. 1516–1527.

* cited by examiner

*Primary Examiner*—Henry W. H. Tsai
(74) *Attorney, Agent, or Firm*—McDonnell Boehnen Hulbert & Berghoff

(57) ABSTRACT

A system and method for compressing and decompressing a binary code image includes preprocessing the image to separately group together the operation codes and the operands that make up the binary code image into a columnar format. The resultant preprocessed data is then compressed using any one of a plurality of compression codes. In turn, the resultant compressed image may be stored in a memory element or transferred using a transmission channel to a different device. The compressed image is then decompressed to reconstruct the binary code image.

29 Claims, 7 Drawing Sheets

© 2000 3Com Corporation. All Rights Reserved.

```
select_comp_columns()
{
        Open input file (binary software image)

If (input file has an open error)
                Exit with error code

If (input file has no data)
        {
                close input file
                Exit with error code
        } set column to '1' while (column < 4)
        {
                while (still data to process in input file)
                {
                        read data from input file and place every columnar byte into comp l
                        call compress() on comp_buffer with output sent to decomp_buffer
                } compression_result = (comp_buffer / decomp_buffer)
                store compression result based upon column index
                reset input file pointer to beginning of file
                increment column by one
        } close input file
        column = index of highest compression_result
        Exit with column as return value
}
```

FIG. 4

© 2000 3Com Corporation. All Rights Reserved.

*— 100*

```
Compress (Destination of Compressed Data,
         Source of Raw Data,
         Length of Raw Data,
         Compression Table Memory,
         Column Width,
         Number of Columns)
{
    Construct and output header with compression information Divide memory into equal parts and then to the next lower power of 2

Select hash function based upon memory size

Initialize compression table memory

While there is data to compress:
    {
        For each column
        {
            Read column data Compare against column table data If data matches table
            {
                Set corresponding column flag bit
            }
            else (data does not match)
            {
                Output raw data & set table
            }
        }
    }
}
```

FIG. 5

© 2000 3Com Corporation. All Rights Reserved.

```
Decompress (Destination of Raw Data,
        Source of Compressed Data,
        Length of Compressed Data,
        Decompression Table Memory)
{
        Read compression information header to obtain number and size of columns Divide memory into equal tables based upon number of columns Reduce each table size to the next lower power of 2

Select hash function based upon table size

Initialize decompression table memory

While there is data to decompress:
        {
                For each column
                {
                        Read block flag If flag bit set for match
                        {
                                Write data to table and output
                        }
                        else (flag not set match)
                        {
                                Output raw data
                        }
                }
        }

While there is residual data
        {
                Output raw data
        }
}
```

FIG. 7

SYSTEM AND METHOD FOR COMPRESSING AND DECOMPRESSING A BINARY CODE IMAGE

FIELD OF THE INVENTION

This present invention relates to software image processing. More specifically, it relates to a system and method for compressing and decompressing a binary code image.

BACKGROUND OF THE INVENTION

Executable code or executable images are files, such as, files ending with extensions for example, but not limited to, ".exe" and ".bin." There is a growing need to maintain multiple executable images in different devices or systems in case of potential damage during normal use or image upgrades. To facilitate the need to maintain redundant or otherwise multiple executable images, either a device's storage space is increased by a factor of two or more, or the image size is reduced. However, it is typically cost prohibitive to increase the storage space of a device. Thus, the reduction in image size, such as, by compressing the software image is a viable solution.

Compression techniques currently in use may only result in a file half the size of the original, typically resulting in undesirable transmission speeds. As a result, new technology such as interactive communication services, requiring larger data files to be stored or transmitted over a network, are possibly limited due to digital data storage size and transmission efficiency. Executable images represented by binary code and hereinafter referred to as "binary code images" must be compressed to travel over the network or be stored in a memory element efficiently. Binary code images are data files consisting of a sequence of 8-bit data or executable code. Binary format is generally used to represent object code which are program instructions translated into a machine-readable form, or data in a transmission stream. Traditional methods typically compress data in a single contiguous stream. However, the nature of binary data, more specifically binary code images does not lend itself well to this methodology, since it includes operation codes mixed in with operands. Operation code is a portion of a machine or assembly language instruction that specifies the type of instruction and the structure of the data on which it operates. The operands are the objects of the computer instruction or mathematical operation. There are few matches between the operation codes and operands, making the compression of a binary code image difficult. As a result, compression ratios for binary code images are less than desirable, making transmission over a network or storage of the image inefficient.

Thus, there is a need to efficiently compress, and subsequently decompress or reconstruct binary code images to enable additional storage capability and to facilitate the transmission of the images over different networks.

SUMMARY OF THE INVENTION

The system and method for compressing and decompressing a binary code image is predicated on the recognition that binary code images are an intermingling of operation codes and operands. Many of the operation codes have similar patterns, while many of the operands have similar patterns. The system and method for compressing and decompressing a binary code image groups the binary code image data to take advantage of the similar patterns present amongst operation codes and similar patterns present amongst operands.

In accordance with one aspect of the present invention, a method for compressing and decompressing a binary code image includes the step of receiving an input of a binary code image and preprocessing the binary code image which includes parsing the image in a columnar format to match operating codes with operating codes and operands with operands. The method includes the step of compressing the preprocessed columnar data using one of a plurality of compression models and codes. The method then includes transferring the compressed image over a network or to a memory device. The method further includes receiving the compressed image and processing the compressed image prior to decompressing the compressed image to yield a reconstructed image.

In accordance with another aspect of the present invention, a system for compressing and decompressing a binary code image includes a first preprocessor to format the binary code image; a first processor to compress the formatted binary code image, a transmission channel or memory device used to channel or store the compressed image; and a second processor to reconstruct or decompress the image.

In a preferred embodiment, the compression and decompression are performed by the same processor, thus the first and second processors are the same processor. In another preferred embodiment, the first processor and second processor are separate and process the image in two different devices or systems.

The foregoing and other objects, features and advantages of the system and method for compressing and decompressing a binary code image will be apparent from the following more particular description of preferred embodiments of the system and the method as illustrated in the accompanying drawings in which like reference characters refer to the same parts throughout the different views.

BRIEF DESCRIPTION OF THE DRAWINGS

Preferred embodiments of the present inventions are described with reference to the following drawings, wherein:

FIG. 4 is a listing of an exemplary set of instructions for preprocessing a binary code image prior to compressing the image in accordance with a preferred embodiment of the present invention;

FIG. 5 is a listing of an exemplary set of instructions for compressing a binary code image in accordance with a preferred embodiment of the present invention;

FIG. 7 is a listing of an exemplary set of instructions for decompressing a binary code image in accordance with a preferred embodiment of the present invention.

DETAILED DESCRIPTION OF PREFERRED EMBODIMENTS

The system and method of the present invention is directed to compressing and decompressing a binary code image to facilitate transferring the binary code image over a data network or to a storage device. The system and method of the present invention includes preprocessing the binary code image, compressing the preprocessed image, transferring the compressed image over a transmission channel or to a memory device and subsequently decompressing the binary code image to reconstruct the binary code image.

Figure 1A:
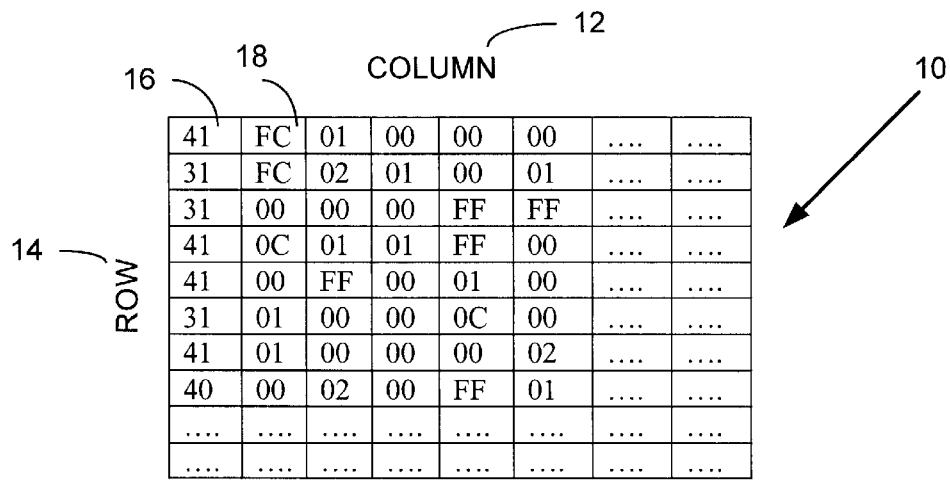
FIG. 1a is a diagram illustrating an exemplary memory image of an executable binary code image.

FIG. 1a illustrates an exemplary memory image 10 of an executable binary code image. The memory image 10 is shown in hexadecimal form for readability. Hexadecimal form uses sixteen rather than base ten for representing numbers. The hexadecimal system uses the digits 0 through 9 and the letters A through F (uppercase or lowercase) to represent the decimal numbers 0 through 15. One hexadecimal digit is equivalent to 4 bits, and 1 byte can be expressed by two hexadecimal digits. The memory image 10 constitutes a portion of the digital memory typically found in a device handling binary images. The memory image 10 labeled having columns 12 and rows 14 may have a more or less number of columns and rows depending on factors such as the available memory size of the device and the size of the binary code image itself.

The binary code image may include operation codes and operands. An operation code typically is a portion of a machine language instruction that specifies the structure of the data on which it operates such as, for example, a group of bits representing the binary code image. An operation code may specify an operation such as adding, subtracting, shifting, or complement commonly referred to as a computer's instruction set. When an operation code is detected by a control unit for example, an arithmetic logic unit (ALU), the control unit typically executes the instruction embedded in the binary image, for example, a sequence of control words are applied to perform the intended operation. Therefore, the operation code of an instruction set typically specifies the operation to be performed. The operation codes of the binary code image are typically represented in a columnar format. The number of columns or bits required for the operation code of instruction is typically a function of the total number of operations in the instruction set. For example, the operation code may consist of at least m bits for up to $2^m$ distinct operations.

The operation code specifies an operation to be performed on the operands which are the objects of the instruction or operation. The operands in FIG. 1a are located in columns 18 onwards after the operation codes represented in column 16 of the binary code image. Remaining columns in (i.e., those columns that are not made up of operands or operation codes) may consist of data typically stored in memory registers relating to the stored binary code image.

Figure 1B:
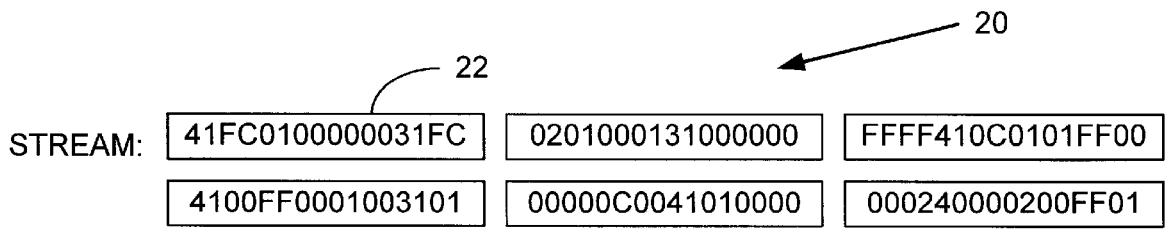
FIG. 1b is a diagram illustrating a memory image evaluated in contiguous order.

Referring to FIG. 1b, the data stream 10 illustrated in FIG. 1a is evaluated in a contiguous order and the resultant data stream 20 is typically blocked into groups of bytes such as, block 22. For example, the first row of the binary code image is analyzed and blocked into blocks of eight bytes. This process continues until all of the rows have been evaluated. However, when analyzing the data stream in a contiguous order, there are few block to block matches found since the operands and the operation codes are mixed together to represent the binary code image.

Figure 1C:
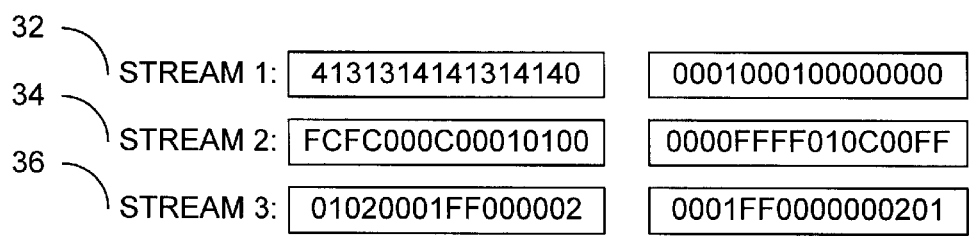
FIG. 1c is a diagram illustrating a memory image evaluated in a columnar order in accordance with a preferred embodiment of the present invention.

FIG. 1c, illustrates the data stream 10 represented in FIG. 1a evaluated in a columnar order and separated into blocks of bytes. In a preferred embodiment of the present invention, the operation codes are grouped preferably with other operation codes and the operands are grouped preferably with other operands. By parsing the data in a columnar format there are characteristically more block to block matches, increasing the compression ratio. Furthermore, the data is parsed into data stream portions where a data stream portion 32 is formed from columns preferably in-groups of three. That is, the first column and the fourth column may make up one data stream portion 32, the second column and the fifth column may make up a second data stream portion 34, and the third column and the sixth column may make up a third data stream portion 36. By formatting and arranging the data in this way, the three data stream portions 32, 34, 36 may be processed in parallel by the system and method for compressing and decompressing a binary code image as described in further detail hereinafter. A greater or lesser number of data stream portions may be used depending on the size of memory or the available size of the image being processed.

Figure 2:
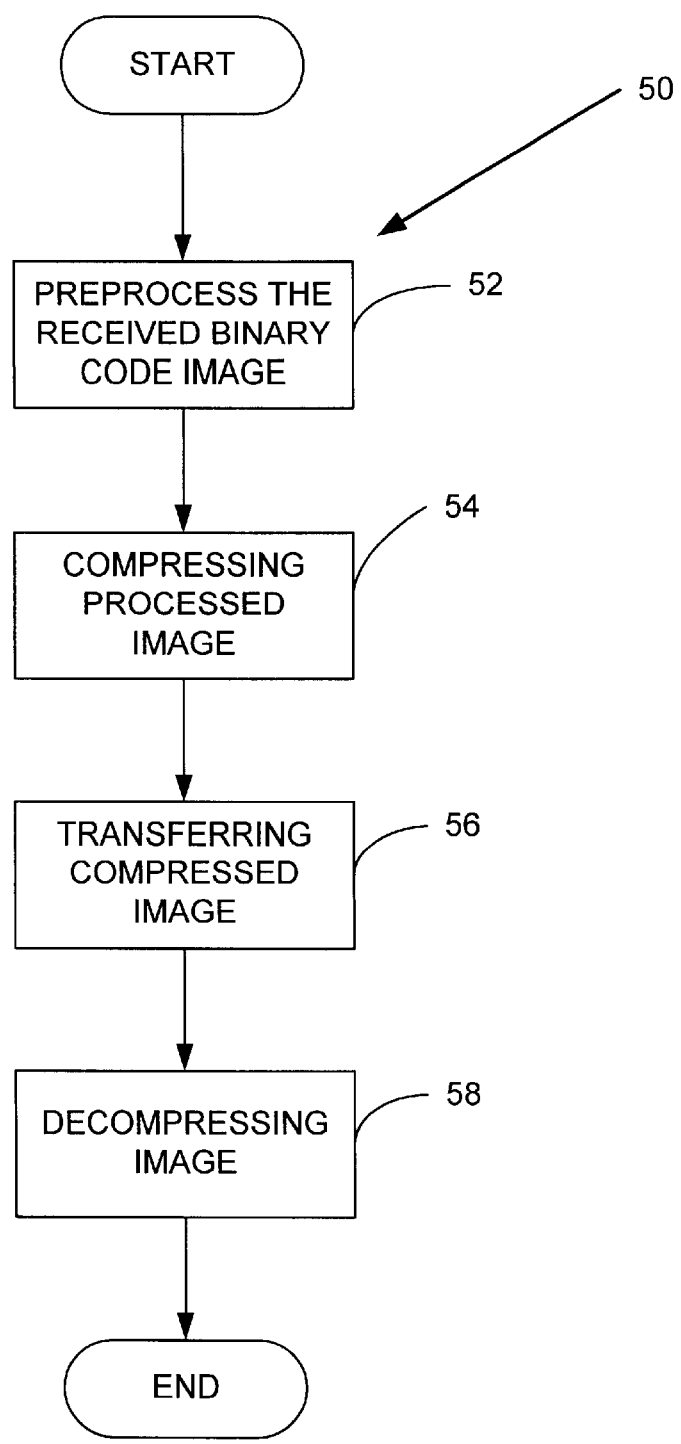
FIG. 2 is a top-level flow diagram illustrating the system and method for transferring a binary code image in accordance with the present invention.

FIG. 2 illustrates a top-level flow diagram of the system and method 50 for compressing and decompressing a binary code image in accordance with the present invention. To save storage space or to provide an efficient method to transmit large image files over a network, a binary code image is preferably sent to the system of the present invention that compresses the file into a more compact form. The system and method 50 shown in FIG. 2 may be applied to a device, for instance, in which executable software images referred to as binary code images are preferably used, such as the memory image 10 shown in FIG. 1a. The present invention may be suitably employed to transmit signals over networks, such as Local Area Networks (LAN), Metropolitan Area Networks (MAN), Wide Area Networks (WAN), Personal Area Networks (PAN) and circuit switched networks, for example, or direct end-to-end connections, as well as with other transmission protocols.

The operating environment for the system to compress and decompress a binary code image of the present invention includes a processing system with at least one Central Processing Unit (CPU) and maybe a memory system. In accordance with the practices of persons skilled in the art of computer programming, the present invention is being described with reference to acts and symbolic representations of operations that are performed by the processing system, unless indicated otherwise. Such acts and operations are sometimes referred to as being "computer-executed", or "CPU executed."

It will be appreciated that the acts and symbolically represented operations include the manipulation of electrical signals by the CPU. An electrical system with data bits causes a resulting transformation or reduction of the electrical signal representation, and the maintenance of data bits at memory locations in the memory system to thereby reconfigure or otherwise after the CPU's operation, as well as other processing of signals. The memory locations where data bits are maintained are physical locations that have particular electrical, magnetic, optical, or organic properties corresponding to the data bits.

The data bits may also be maintained on a computer readable medium including magnetic disks, optical disks, organic disks, and any other volatile or non-volatile mass storage system readable by the CPU. The computer readable medium includes cooperating or interconnected computer readable media, which exist exclusively on the processing system or is distributed among multiple interconnected processing systems that may be local or remote to the processing system.

The system and method for compressing and decompressing a binary code images in accordance with the present invention includes a preprocessing step 52 once the binary code image is received. The preprocessing step 52 includes evaluating the raw data to determine the length of raw data, memory required for a table, number of and width of columns required, construction and outputting of a header, division of memory into a number of columns, selection of a hash function based on memory size and initializing of the compression table memory.

The method 50 further includes the step 54 of compressing the processed image using a first processor that provides a compression function that results in a compressed image. Further, the compressed image is transferred per step 56 to a memory storage device or a transmission channel. The method further includes the step 58 of decompressing the compressed image using a second processor that provides a decompression function.

In a preferred embodiment, the first processor performs the compression function, per step 54, preferably by processing the memory image 10 in parallel. The output of the compression function, the compressed data, is transferred into a storage device or a transmission channel. The storage device may include any device in which the digitally compressed data may be stored in such as, for example, but not limited to, a random access memory ("RAM"), a buffer, and an electrically erasable programmable read-only memory ("EEPROM"). The transmission channel may include, but is not limited to, a data bus internal to a computer or processor, a telephone line, a cable, and may include electromagnetic transmission such as radio frequency or infrared transmission. The second processor receives the compressed image from the transmission channel, usually through an interface internal to a computer or an interface external to a computer such as any LAN device, a cable modem or Digital Subscriber Line (DSL) modem and performs a decompression function on the compressed image per step 58. The resultant decompressed image may be viewed, stored, or further processed.

Figure 3:
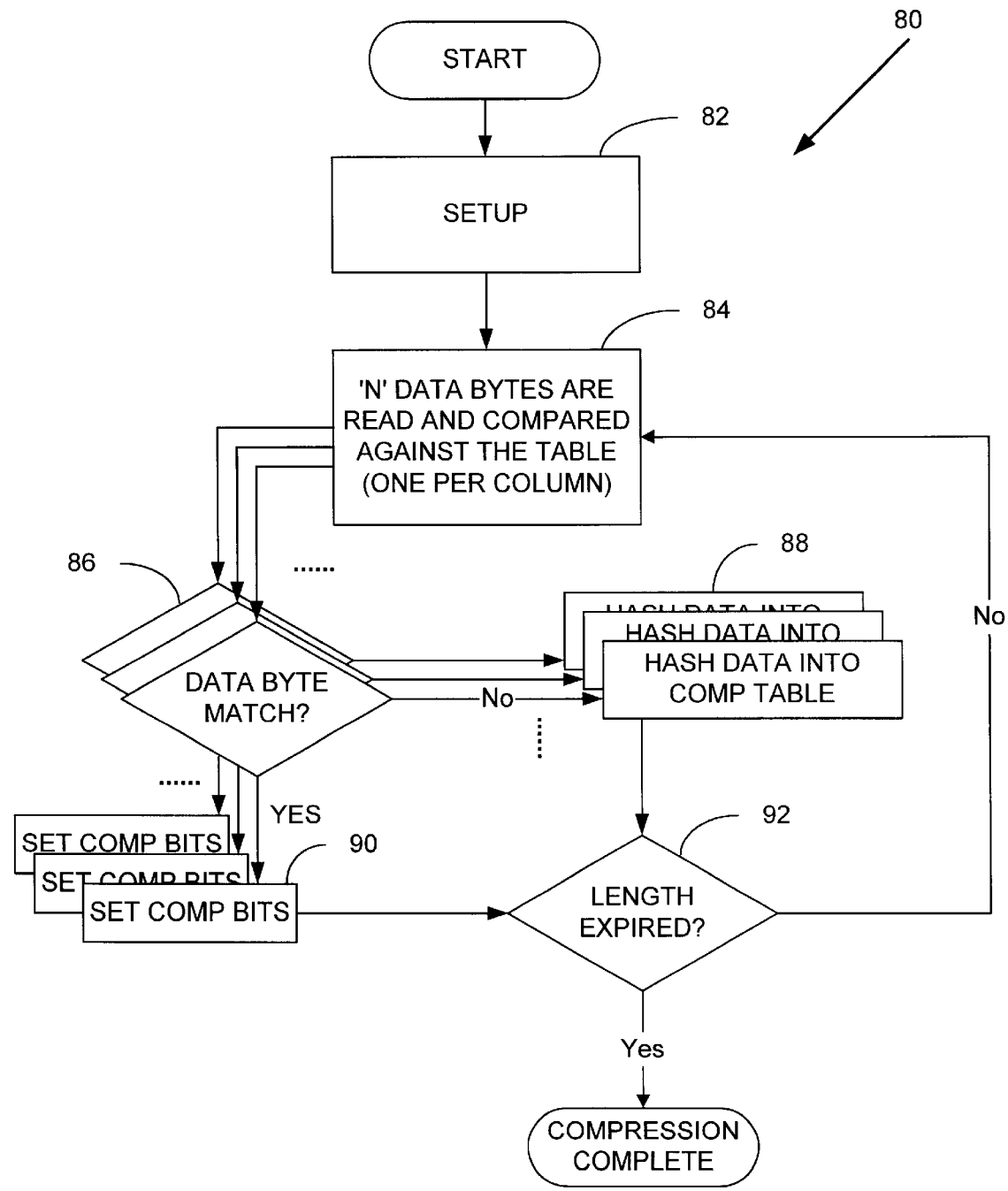
FIG. 3 is a flow diagram illustrating a preferred embodiment of a method for compressing a binary code image in accordance with the present invention.

FIG. 3 illustrates a flowchart of a method 80 for compressing data in accordance with a preferred embodiment of the present invention. At step 82, the setup or preprocessing process preferably includes initialization of a memory storage device, initialization of the image data, and preprocessing of the image data. The setup process per step 82 retrieves the binary code image from either a memory storage unit, a buffer, a transmission channel, or from any device connected to the preprocessor and having an uncompressed binary code image therein. Once the image is retrieved the step 82 of setup may generate a header to be stored with the resultant compressed data. The header preferably contains information that may be used to decompress the data, such as, for example, image size including the number of columns of data and the size, such as, the width of the data columns. Setup preferably initializes the compression table memory, selects a hash function, and divides available compression memory according to a number of columns of data.

FIG. 4 is a listing of exemplary instructions that pertain to the setup process in accordance with a preferred embodiment of preprocessing the binary code image in accordance with the present invention.

Referring back to FIGS. 1a and 1c, the data is separated into data stream portions for example, data streams portions 32, 34, 36. The binary code image data is divided into a prescribed number of columns, preferably in-groups of three. That is, the first column and the fourth column may make up one data stream portion, the second column and the fifth column may make up a second data stream portion, and the third column and the sixth column may make up a third data stream portion and so on. Each data stream portion, is made up of multiple columns as illustrated in the three data stream portions shown in FIG. 1c, and is grouped into blocks of bytes, preferably having 7 bytes in one block. The creation of multiple data stream portions facilitates the processing of the multiple data stream portions in parallel by the compression process in accordance with the present invention. A greater or lesser number of data stream portions may be used depending on the size of the memory or the size of the image being processed. Parallel processing involves the processor reading the first byte of each data stream portion concurrently. The compression function then processes the first byte of each data stream portion simultaneously until the image data is compressed. Thus, the compression function preferably reads N data bytes, where N refers to the number of data stream portions that are available for processing. In FIG. 1c, there are three data stream portions 32, 34, 36 illustrated although more or less number of data stream portions may be used.

The compression function preferably performs predictive compression by creating a table, such as, the compression table preferably initialized by the setup process in step 82. In lossless or reversible compression, the task of modeling is typically split into two steps. In the first step, a predictive compression model is used to predict binary code values and replace them by the error in the prediction. If prediction is based on previously transmitted values, then knowing the prediction error and the prediction scheme, the receiver can recover the value of the original binary code. In the second step, a prediction error model is constructed, which is used to drive a variable length coder for encoding prediction errors.

The compression table includes hash values based upon the hash of previous characters, such as, previous characters that may include previous blocks of image data that have been processed. A hashing function is a transformation that maps an identifier to a numerical value. Hashing is used to convert an identifier or key, meaningful to a user, into a value for the location of the corresponding data in a structure, such as the compression table. The compression function then preferably groups the information bytes (i.e., bytes containing binary code image data) with an assigned flag byte wherein the flag byte preferably precedes the information data. Each bit of the flag byte corresponds to one byte of the seven bytes of information data to provide the decompression function with necessary information for reconstructing the data into the image. A greater or lesser number of information bytes and flag bytes may be used to accommodate larger or smaller blocks of data in accordance with the present invention.

For example, referring back to the flowchart illustrated in FIG. 3, the first byte of each data stream is read by the compression function and compared to the table referred to as the compression table per step 84. A data byte match is determined per step 86. If the hash value of the first byte of information data is not present in the compression table per step 88, then the hash value is placed into the compression table, a corresponding bit in the flag byte is set to logic 0 and the first byte is output to the transmission channel. If the hash value of the first byte is present in the compression table, for example, the compression function has processed this particular hash value before, then the corresponding flag bit is set to logic 1 per step 90, and the byte is not output to the transmission channel. Thus, the flag byte is made up of logic 1's and logic 0's depending on if the corresponding information byte has been processed before or not. The compression function processes each byte of information data until the length of each data stream portion has expired as determined per step 92, whereupon the compression function is completed.

An exemplary listing of the instructions to perform the compression function in a first processor in accordance with a preferred embodiment is shown in FIG. 5. There are many different compression models and codes and corresponding hash functions known in the art that may be used to hash the binary code image data in accordance with the present invention. The compression function may create a hash value by utilizing codes such as, but not limited to, all the Huffman codes such as, the adaptive Huffman code; Golomb code; Rice code; and all Ziv-Lempel (LZ) codes or all the LZW codes. The hash function may be chosen so as to tailor the function to the specific binary code image data. Particular coding schemes such as the Huffman codes may utilize a pre-defined encoding table that remain the same regardless of the information being compressed. A pre-defined encoding table may assist the compression and decompression functions to agree on the binary codes used to represent each character or group of characters.

An exemplary data stream that may be compressed using the system and the method of the present invention may be represented as follows:

4141 4141 4141 41 4141 4141 4141 41
    4141 4141 4141 41 4141 4141 4141 41
    4142 4142 4142 41 4241 4241 4241 42
    7878 7878 7878 78

Compressing the above binary code image data using the system and method of the present invention outputs the following:

604141414141 604141414141 6f41 6f41 414241424142
       604241424142 607878787878 wherein, flag=0x60–2 bytes (5 and 6) in this block were guessed correctly.
    File: 4141414141
    Compression table: 4141
    flag=0x60–2 bytes (5 and 6) in this block were guessed correctly.
    File: 4141414141
    Compression table: 4141
    flag=0x6f–6 bytes (0–3, 5 and 6) in this block were guessed correctly.
    File: 41
    Compression table: 41414141 4141
    flag=0x6f–6 bytes (0–3, 5 and 6) in this block were guessed correctly.
    File: 41
    Compression table: 41414141 4141
    flag=0x41–2 bytes (0 and 6) in this block were guessed correctly.
    File: 4241424142
    Compression table: 4142
    flag=0x60–2 bytes (5 and 6) in this block were guessed correctly.
    File: 4241424142
    Compression table: 4142
    flag=0x60–2 bytes (5 and 6) in this block were guessed correctly.
    File: 7878787878
    Compression table: 7878

Figure 6:
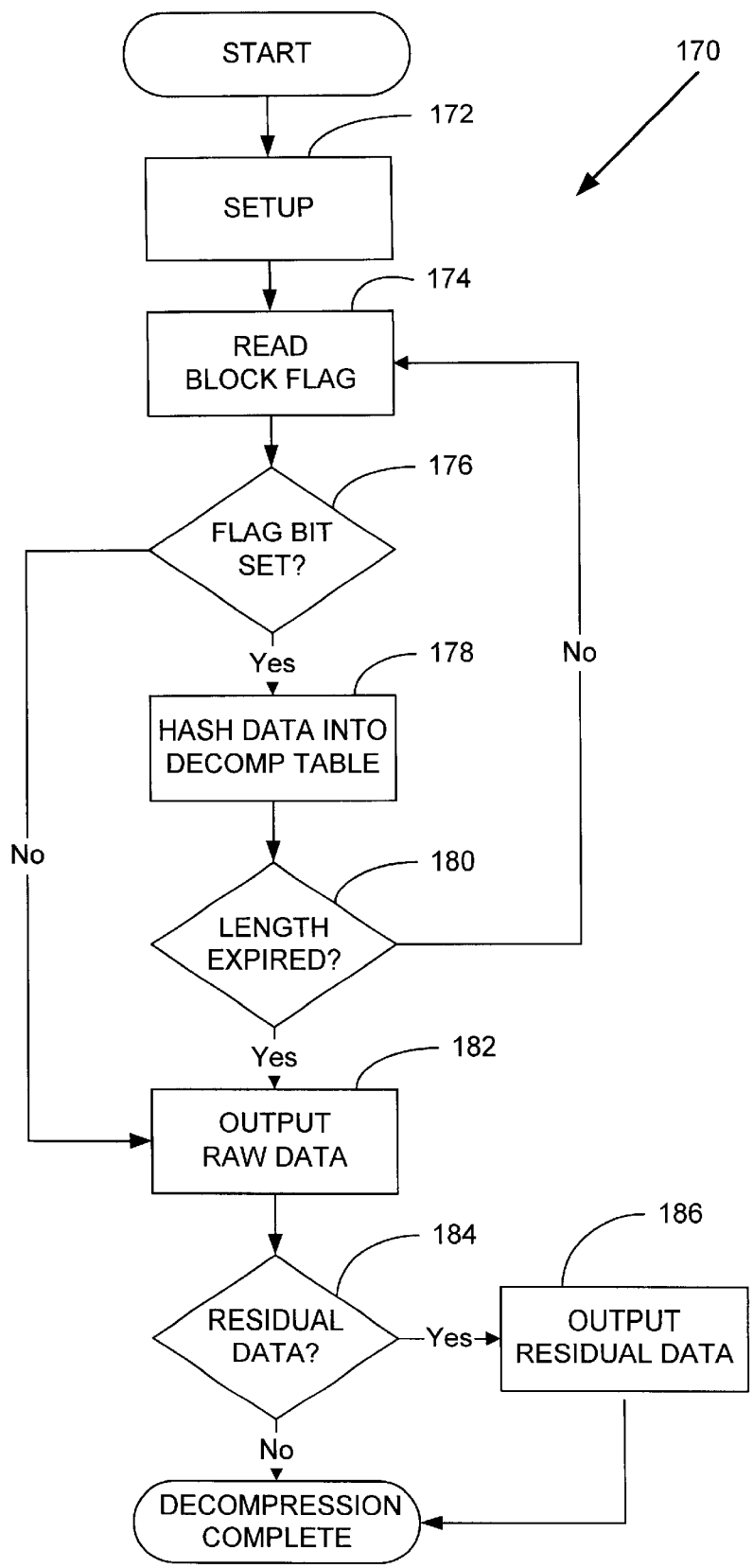
FIG. 6 is a flow diagram illustrating a preferred embodiment of a method for decompressing a binary code image in accordance with a preferred embodiment of the present invention.

FIG. 6 illustrates a flowchart of a preferred embodiment of a method 170 for decompressing an image in accordance with the present invention. The step of setup 172 preferably includes initialization of a memory storage device, initialization of the compressed image data, and preprocessing of the image data. The step of setup 172 retrieves the compressed binary code image from either a memory storage unit, a buffer, a transmission channel, or from any device connected to the processor executing the decompression function. Once the compressed image is retrieved, the step of setup 172 may utilize a header preferably generated by the compression function. The header contains information used to decompress the compressed data such as the original image size including the number of columns of data and the size of the data columns. The step of setup 172 preferably initializes a decompression table memory (decompression table), selects a hash function based upon the table memory size, and divides available decompression memory according to the number of columns of data.

After the data has been processed in step 172, it is ready to be decompressed to reconstruct the contiguous data. The decompression function reads the flag byte of the first data block per step 174. The method 170 then, determines if a flag bit is set per step 176. If the flag bit is set (i.e., equal to logic 1), then the decompression function places the hash value into decompression table and outputs the data per step 178. The decompression function processes each byte of information data until the length of each data stream portion has expired as determined per step 180. If the flag bit is not set (i.e., equal to logic 0), then the decompression function outputs the data directly per step 182. After the first block has been processed, the decompression function moves to the next block and examines the flag byte, thus repeating the process again. It should be noted that similar to the compression function, decompression of different data stream portions of the compressed image may occur in parallel. The decompression function reads the flag byte and processes the data blocks accordingly until the last flag byte is read whereupon the decompression function checks for left over data referred to as residual data per step 184. Residual data maybe defined as data that has a lesser number than the number of prescribed bytes, such as, for example, less than 7 bytes in a preferred embodiment. If residual data exists, the decompression function outputs the residual data per step 186. FIG. 7 is an exemplary listing of instructions to perform the decompression function in accordance with a preferred embodiment of the present invention.

The theoretical maximum compression ratio achieved using the system and method for compressing and decompressing a binary code image in accordance with the present invention is 8:1. The system and method of the present invention yields better compression ratios when used with Reduced Instruction Set Computers (RISC) which are microprocessors that are designed to perform a smaller number of types of computer instructions so that they can operate at a higher speed. The lesser the number of instructions, the greater is the probability of finding a match in the columns of image data.

It should be understood that the programs, processes, methods and systems described herein are not related or limited to any particular type of computer or network system (hardware or software), unless indicated otherwise. Various types of general purpose or specialized computer systems may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams. While various elements of the preferred embodiments have been described as being implemented in software, in other embodiments in hardware or firmware implementations may alternatively be used, and vice-versa.

It will be apparent to those of ordinary skill in the art that methods involved in the system and method for compressing and decompressing a binary code image may be embodied in a computer program product that includes a computer usable medium. For example, such as, a computer usable medium can include a readable memory device, such as a hard drive device, CD-ROM, a DVD-ROM, or a computer diskette, having computer readable program code segments stored thereon. The computer readable medium can also include a communications or transmission medium, such as, a bus or a communication link, either optical, wired or wireless having program code segments carried thereon as digital or analog data signals.

The claims should not be read as limited to the described order or elements unless stated to that effect. Therefore, all embodiments that come within the scope and spirit of the following claims and equivalents thereto are claimed as the invention.

What is claimed is:

1. A system to compress and decompress a binary code image comprising:
   a preprocessor to process the binary code image having operation codes and image data, the preprocessor parsing the image data into a columnar format to result in a preprocessed image;
   a first processor to compress the preprocessed image into a compressed image;
   a channel to transmit the compressed image; and
   a second processor to decompress the compressed image.

2. The system of claim 1, wherein the second processor is the same as the first processor.

3. The system of claim 1, further comprising a memory for storing the compressed image in a memory device.

4. The system of claim 1, wherein the channel includes at least one of a data bus and a transmission link.

5. The system of claim 4, wherein the transmission link includes at least one of a physical link, a radio-frequency link and an infrared link.

6. The system of claim 1, wherein the preprocessor generates a number of columns into which data is parsed and selects a compression code to be used by first and second processors.

7. The system of claim 1, wherein the first processor compresses the preprocessed image using compression code, selected from the group consisting of a predictive model, Huffman code, Ziv-Lempel codes, Rice code, and Golomb code.

8. The system of claim 1, wherein the first processor uses a plurality of hash tables for compressing a plurality of columns of the image data.

9. The system of claim 1, wherein the second processor includes a preprocessor to preprocess the compressed image.

10. The system of claim 9, wherein the preprocessor initializes a decompression table and formats the compressed image for decompression.

11. An apparatus for compressing a binary code image, said binary code image including a plurality operation codes and a plurality of operands, said apparatus comprising:
   a preprocessor for preprocessing the binary code image to group together the plurality of operation codes and group together the plurality of operands to result in a preprocessed image; and
   a processor to compress the preprocessed image and create a compressed image;
   wherein the preprocessor generates a number of columns into which the plurality of operation codes and the plurality of operands are parsed.

12. The apparatus of claim 11, wherein the preprocessor selects a compression code to be used by the processor.

13. The apparatus of claim 11, wherein the apparatus includes a channel to transmit the compressed image.

14. The apparatus of claim 11, wherein the apparatus includes a memory for storing the compressed image.

15. The apparatus of claim 11, wherein the processor uses one of a compression code, selected from the group consisting of a Huffman code, a Rice code, a Golomb code, and a LZW codes.

16. The apparatus of claim 11, wherein the preprocessor arranges the data in a columnar format.

17. An apparatus for decompressing a binary code image, said binary code image including a plurality of operation codes and a plurality of operands, said apparatus comprising:
   a preprocessor for preprocessing a compressed image, the preprocessor generates a number of columns into which the plurality of operation codes and the plurality of operands are parsed; and
   a processor to decompress the compressed image.

18. The apparatus of claim 17, wherein the preprocessor generates a decompression table.

19. The apparatus of claim 17 wherein the preprocessor selects a decompression code to be used by the processor.

20. The apparatus of claim 17, wherein the compressed image is received from one of a memory and a transmission channel.

21. The apparatus of claim 17, wherein the processor uses decompression code selected from the group consisting of a Huffman code, a LZW codes, a Rice code, and a Golomb code.

22. A method for compressing and decompressing a binary code image, said binary code image including a plurality of operation codes and a plurality of operands, the method comprising:
   preprocessing the binary code image to generate a preprocessed image by grouping together the operation codes and grouping together the operands;
   wherein the step of preprocessing the binary code image includes generating a number of columns into which the plurality of operation codes and the plurality of operands are parsed and selecting a compression code to be used for compressing the preprocessed image and decompressing the compressed image;
   compressing the preprocessed image to generate a compressed image;
   transferring the compressed image; and
   decompressing the compressed image.

23. A computer readable medium having stored therein instructions for causing a central processing unit-to execute the method of claim 22.

24. The method for compressing and decompressing a binary code image of claim 22, wherein the step of compressing the preprocessed image includes using a compression code, selected from the group consisting of a predictive model, a Huffman code, a Ziv-Lempel code, a Rice code and a Golomb code.

25. The method for compressing and decompressing a binary code image of claim 22, wherein the step of compressing the preprocessed image including using a plurality of hash tables for compressing a plurality of columns of the preprocessed image.

26. The method for compressing and decompressing a binary code image of claim 22 wherein the step of decompressing the compressed image includes preprocessing the compressed image by initializing a decompression table and formatting the compressed image for decompression.

27. The method of compressing and decompressing a binary code image of claim 22, wherein the step of compressing the preprocessed image and step of decompressing the compressed image occurs in a single device.

28. The method of compressing and decompressing a binary code image of claim 22, wherein the step of compressing the preprocessed image occurs in a first device and the step of decompressing the compressed image occurs in a second device.

29. The method of compressing and decompressing a binary code image of claim 22, wherein the step of transferring the compressed image includes transferring the compressed image to one of a storage device and a transmission channel including at least one of a data bus and a transmission link.

* * * * *